United States Patent [19]

Hanson

[11] 3,932,741
[45] Jan. 13, 1976

[54] CIRCUIT TO REDUCE HARMONIC DISTORTION IN A TRIANGULAR WAVE-FORM FUNCTION GENERATOR

[75] Inventor: Raymond C. Hanson, Loveland, Colo.

[73] Assignee: Hewlett-Packard Company, Palo Alto, Calif.

[22] Filed: Sept. 30, 1974

[21] Appl. No.: 510,273

[52] U.S. Cl. ............... 235/197; 235/183; 307/228; 328/181
[51] Int. Cl.² ...................... G06G 7/26; H03K 4/08
[58] Field of Search ............ 235/197, 183; 307/228, 307/229, 230; 328/35, 127, 181–185

[56] References Cited
UNITED STATES PATENTS

| | | | |
|---|---|---|---|
| 3,577,007 | 5/1971 | Cross | 328/181 X |
| 3,610,952 | 10/1971 | Chandos | 328/181 X |
| 3,676,698 | 7/1972 | Hunter | 328/183 X |
| 3,713,000 | 1/1973 | Driskell et al. | 328/181 |
| 3,743,951 | 7/1973 | Carroll | 328/181 |

*Primary Examiner*—Joseph F. Ruggiero
*Attorney, Agent, or Firm*—Ronald E. Grubman

[57] ABSTRACT

A device is disclosed for generating a triangular wave form for use in an electronic function generator. The device employs a level detector which produces a square wave output to drive a triangular function generator in a loop arrangement.

Amplitude symmetry of the triangular wave is maintained by sensing the average value and comparing it with a reference level to generate an error signal which in turn serves as a reference input to the level detector. The output of the level detector is therefore corrected to cancel drifts in the average or base line value of the triangular wave form.

Time symmetry, or symmetry of the positive and negative slopes of the triangle is maintained by means of a feedback loop utilizing a stable current source. The time symmetry of the square wave is the same as that of the triangle. The square wave is sensed and serves to switch on and off the stable current source. By integrating the current from the current source a voltage is obtained which is proportional to time asymmetries in the square wave. An error signal derived from the integrated current is used in the triangle generator to control either the positive or negative slope of the wave form. A triangular wave form is therefore generated which has both stable amplitude symmetry and time symmetry.

3 Claims, 1 Drawing Figure

3,932,741

CIRCUIT TO REDUCE HARMONIC DISTORTION IN A TRIANGULAR WAVE-FORM FUNCTION GENERATOR

BACKGROUND AND SUMMARY OF THE INVENTION

Electronic function generators are devices which generate various wave forms. An essential element in many function generators is a circuit which produces a triangular wave form, typically by charging a capacitor between fixed limits. The triangular wave shape is produced by means of a voltage detector which reverses the direction of the charging source when appropriate limits are reached. In a typical function generator sinusoidal wave forms are produced from the triangular wave form by applying the triangular signal to a nonlinear network, typically a diode network.

It is characteristic of the above-described function generators that the nonlinear diode network produces harmonic distortion of a sinusoidal signal at a desired fundamental frequency. By this is meant that undesired harmonics of the fundamental frequency appear in the output of the device. Generally it is desirable to reduce the amplitude of these harmonics to minimum levels. The magnitude of the harmonic distortion products depends principally on two factors; one is the intrinsic characteristics of the nonlinear network which shapes triangular wave forms into a sinusoidal wave. Another critical factor is the integrity of the triangular wave form itself.

The present invention is concerned with generating a triangular wave form which is extremely stable and insensitive to drift with temperature or time. The invention provides amplitude symmetry about the average value so that long term drifts of the average value (i.e., base line drifts) are minimized. The invention further provides long term time symmetry of the wave form; i.e., it assures that the absolute value of the positive and negative slopes always tend toward equality.

In accordance with the preferred embodiment, a loop is employed in which a level detector provides a square wave signal to a triangle generator. Amplitude symmetry of the triangular wave is provided by detecting and integrating the triangular wave form to produce an average value. The average value is compared to a stable reference whence an error signal is derived which is applied to a level detector to control the amplitude of the triangular wave form. In response to the error signal the level detector tends to increase or decrease the amplitude so as to cancel the error and restore amplitude symmetry.

The time asymmetry of the triangular wave is the same as that of the square wave in the loop. To provide time symmetry, the square wave is used to switch a stable current source whose integrated value is therefore proportional to the time symmetry (duty cycle) of the square wave. An error signal generated from the integrated current is used to control either the positive or negative slope produced by the triangle generator in order to always restore time symmetry to the triangular wave form.

DESCRIPTION OF THE INVENTION

Figure 1:
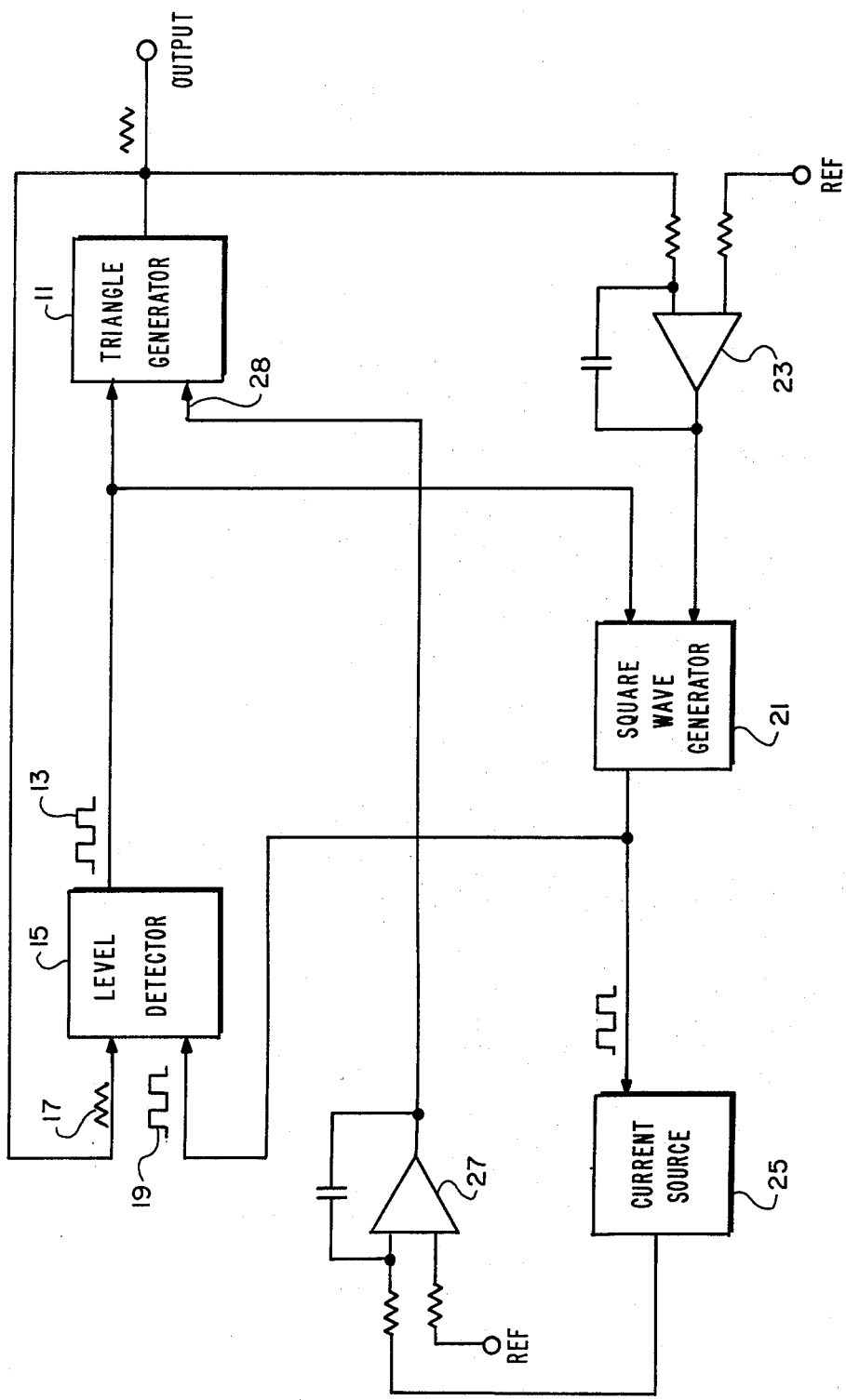
FIG. 1 illustrates a preferred embodiment of the invention in which two feedback loops are used to provide amplitude and time symmetry in a triangular wave form generator.

In FIG. 1 there is shown a triangle wave form generator 11. Triangle generators are known in the art and are typically of one of two types. A first form of triangle generator uses circuitry which simply integrates an input square wave to produce a triangular output. A second form of generator to be described more fully below employs a square wave input to gate a current source which charges a capacitor. Either type is suitable for use in the preferred embodiment.

The triangular output from generator 11 is fed back and serves as an input 17 to a level detector 15. Level detector 15 compares triangular input 17 with a reference signal and generates a bi-level output which is high or low depending on whether the triangular input level is above or below the reference level. In the present device, the reference input to detector 15 is itself a square wave input 19 whose period and phase are coincident with the period and phase of the triangular input. Thus triangular input 17 will effectively toggle the level detector to produce a square wave output 13 of the same period as that of its inputs. As will be described further below, square wave input 19 is also derived from the triangular wave, so that triangle generator 11 and level detector 15 form a closed loop oscillating circuit.

If the invention is to be used in a function generator to produce sinusoidal wave forms, the triangular output of generator 11 is directed to a nonlinear network, e.g. a diode network which generates sinusoidal functions in response to the triangular input. To minimize harmonic distortion on the sinusoidal output the invention provides feedback circuitry to ensure amplitude and time symmetry of the triangular wave. By the term amplitude symmetry is meant that the peak values of the wave form are symmetric about the average value. An amplitude asymmetry would produce a drift in the average or base line value of the triangle which would generate undesired even and odd harmonics from a nonlinear network having the asymmetric triangle as its input.

To provide amplitude symmetry the device utilizes a feedback loop so that the level of reference input 19 to level detector 15 is not constant, but is itself dependent on the amplitude symmetry of the triangle as follows: Reference input 19 is supplied by a square wave generator 21 which may be, e.g. a switched current source. The period of generator 21 is controlled by the square wave output of level detector 15. However, the amplitude of its output is responsive to the average value of the triangular wave form output of generator 15. More particularly the triangular wave form is integrated and the resultant average value compared with a stable reference level in an integrator 23. Whenever there is a difference between the average value of the triangular wave form and the reference level, integrator 23 produces an error voltage which controls the amplitude of the square wave produced by generator 21. Thus, for example, if the average value of the triangular wave form is increasing, integrator 23 will generate an error signal which decreases the amplitude of the square wave generator 21. In response to the decreased amplitude level detector 15 will output a square wave 13 whose amplitude is decreased. Triangle generator 11 will therefore generate a triangular wave form whose amplitude tends to be decreasing thereby decreasing the average value. Amplitude symmetry is thereby provided.

In addition to the amplitude symmetry described above the triangular wave form must also have precise and stable time symmetry. By this is meant that the positive and negative slopes must have the same absolute value. Time asymmetry in the triangular wave form will produce undesired even harmonics in the output of a nonlinear network for generating sinusoids from the triangle. The present invention employs a second feedback loop to ensure stable time symmetry. Since level detector 15 generates square waves in response to the triangular input 17, any time asymmetry of the triangle will appear also as a time asymmetry in the various square waves around the circuit. Thus the ratio of the time intervals during which square wave 13 is at its high and low levels is a measure of the time asymmetry of the triangular wave form. This ratio may be accurately determined according to the invention by sensing the square wave either at the output of level detector 15 or alternately at the output of square wave generator 21 (the latter mode being illustrated in FIG. 1). The sensed output is then used to switch on and off a very accurate current source 25. An integrator 27 integrates the resulting current to a DC voltage which will be proportional to time asymmetry of the square wave. The integrated current signal is compared to a reference voltage by means of integrator 27 to generate an error signal 28. The error voltage is fed back to triangle generator 11 to control either the positive or negative slope of the triangle by e.g. varying the charging current in a triangle generator which utilizes a gated current source to charge a capacitor. The invention thereby advantageously employs a very stable current source as a reference to produce a triangular wave form with an accurate and stable time symmetry.

I claim:

1. A device for generating triangular wave forms comprising:
   first means for generating a triangular wave form in response to an input signal;
   level detecting means interconnected in loop configuration with said first means for providing a first square wave signal to said first means in response to said triangular wave form applied at a first input and a level detector reference signal applied at a second input of said level detecting means;
   integrator means interconnected with said first means for integrating said triangular wave form to produce an average value thereof indicative of the amplitude symmetry of said triangular wave form and comparing said average value with a reference level to produce an amplitude symmetry error signal; and
   square wave generating means interconnected between said integrator means and said level detecting means for producing a second square wave signal of the same frequency as said first square wave signal and having an amplitude responsive to said amplitude symmetry error signal from said integrator means, said second square wave signal serving as said level detector reference signal.

2. A device as in claim 1 further comprising:
   current generating means for producing an output current responsive to one of said first and second square wave signals; and
   additional integrating means for integrating said output current to produce a voltage level indicative of the time symmetry of said one square wave and comparing said voltage level with a reference level to produce a time symmetry error signal being applied to said first means to control a slope of said triangular waveform.

3. A device for generating triangular wave forms comprising:
   first means for generating a triangular wave form in response to an input signal;
   level detecting means interconnected in loop configuration with said first means for providing a square wave signal to said first means in response to said triangular wave form applied at a first input and a level detector reference signal applied at a second input of said level detecting means;
   current generating means for producing an output current responsive to said square wave signal; and
   integrating means for integrating said output current to produce a voltage level indicative of the time symmetry of said square wave and comparing said voltage level with a reference level to produce a time symmetry error signal, said time symmetry error signal being applied to said first means to control a slope of said triangular wave form.

* * * * *